United States Patent
Benedict et al.

(10) Patent No.: US 7,466,197 B2
(45) Date of Patent: Dec. 16, 2008

(54) SELECTING SAMPLES FOR AMPLIFIER DIGITAL PREDISTORTION ESTIMATION

(75) Inventors: Russell B. Benedict, Bridgewater, NJ (US); Walter Honcharenko, Monmouth Junction, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 85 days.

(21) Appl. No.: 11/274,927

(22) Filed: Nov. 15, 2005

(65) Prior Publication Data

US 2007/0109047 A1    May 17, 2007

(51) Int. Cl.
*H03F 1/26* (2006.01)
(52) U.S. Cl. ..................... 330/149; 330/136
(58) Field of Classification Search ............. 330/149, 330/136; 455/114.3
See application file for complete search history.

(56) References Cited

U.S. PATENT DOCUMENTS

| 5,867,065 | A  | * | 2/1999  | Leyendecker | ............... 330/149 |
| 7,062,233 | B2 | * | 6/2006  | Huttunen    | ................. 455/114.3 |
| 2006/0232332 | A1 | * | 10/2006 | Braithwaite | ................. 330/149 |

* cited by examiner

*Primary Examiner*—Robert Pascal
*Assistant Examiner*—Hieu P Nguyen

(57) ABSTRACT

The present invention provides a method for selecting samples for digital amplifier predistortion estimation. The method may include accessing a plurality of samples. Each sample includes information associated with an input signal and a corresponding output signal of the amplifier. The method may also include selecting a subset of the plurality of samples based on a sample distribution and determining a transfer function associated with the amplifier based on the subset of the plurality of samples. The method further includes determining a predistortion function based on the transfer function and applying the predistortion function to the input signal of the amplifier.

22 Claims, 4 Drawing Sheets

SELECTING SAMPLES FOR AMPLIFIER DIGITAL PREDISTORTION ESTIMATION

BACKGROUND OF THE INVENTION

1. Field of the Invention

This invention relates generally to communication systems, and, more particularly, to wireless communication systems.

2. Description of the Related Art

An ideal amplifier receives an input signal and provides an amplified output signal without introducing any phase, amplitude, or frequency distortion. However, in practice amplifiers are rarely, if ever, ideal and so the amplified output signal generally includes phase, amplitude, and/or frequency distortions introduced by the amplifier. The amplified output signal may be linearized to remove some or all of the distortions introduced by the amplifier. Predistortion of the input signal is one technique for linearizing the amplified output signal. To predistort the input signal, samples of the input and output waveforms are captured and compared to determine the amplifier response, which is usually represented as a matrix. The amplifier response matrix may then be inverted and applied to the input signal to predistort the input signal.

Predistortion is a computationally intensive operation. For example, to predistort a radiofrequency signal used in wireless communication, some 8000 to 32,000 samples of the input and output waveforms may be captured and used to determine a non-linear transfer characteristic that represents the response of the amplifier. The amplifier's transfer function must be periodically reevaluated to maintain the accuracy of the predistortion correction function, at least in part because the amplifier response matrix may change over time due to fluctuations in the transmission power, the ambient temperature, and other intrinsic and/or environmental factors. For example, elements of the amplifier transfer function may change—on time scales as short as 2 seconds. However, the large number of matrix manipulations required to determine the predistortion correction may take as long as several seconds to perform. Consequently, predistortion of the radiofrequency signals used in wireless communication typically cannot be implemented in real time.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the present invention, a method is provided for selecting samples for digital amplifier predistortion estimation. The method may include accessing a plurality of samples. Each sample includes information associated with an input signal and a corresponding output signal of the amplifier. The method may also include selecting a subset of the plurality of samples based on a sample distribution and determining a transfer function associated with the amplifier based on the subset of the plurality of samples. The method further includes determining a predistortion function based on the transfer function and applying the predistortion function to the input signal of the amplifier.

BRIEF DESCRIPTION OF THE DRAWINGS

The invention may be understood by reference to the following description taken in conjunction with the accompanying drawings, in which like reference numerals identify like elements, and in which.

Figure 1:
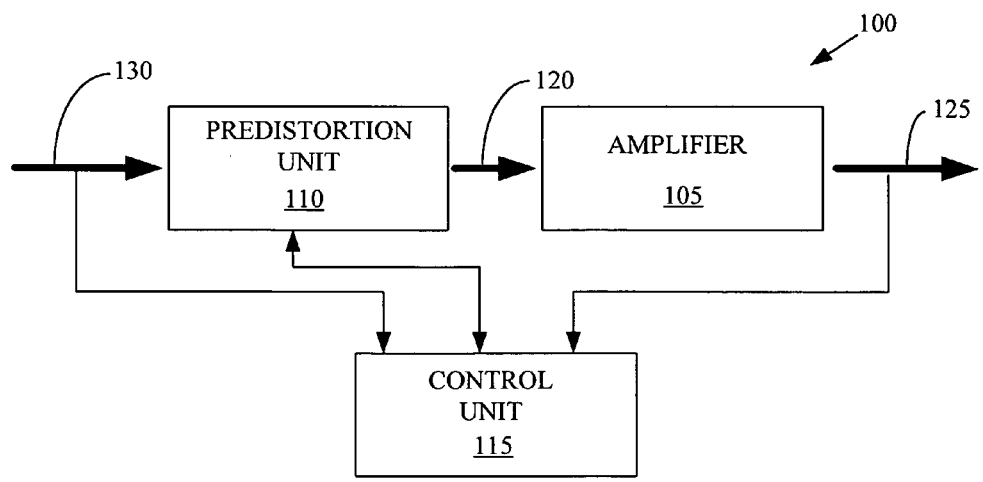
FIG. 1 conceptually illustrates one exemplary embodiment of an amplifier system, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 conceptually illustrates one exemplary embodiment of an amplifier system 100. In the illustrated embodiment, the amplifier system 100 includes an amplifier 105, a predistortion unit 110, and a control unit 115. For example, the amplifier 105 may be a radiofrequency amplifier that may be used in a wireless communication device such as a base station, a router, a cellular telephone, a personal data assistant, a smart phone, a text messaging device, a wireless card, a laptop computer, a desktop computer, and the like. Persons of ordinary skill in the art should appreciate that the amplifier 105, the pre-distortion unit 110, and/or the control unit 115 may be implemented in any number and/or type of devices. Moreover, these elements may be implemented in software, firmware, hardware, or any combination thereof.

The amplifier 105 is configured to amplify a signal 120 to form an amplified signal 125. The amplifier 105 may introduce one or more phase, amplitude, and/or frequency distortions into the amplified signal 125. Accordingly, the predistortion unit 110 is configured to predistort an input signal 130 to form the signal 120 that is provided to the amplifier 105. The control unit 115 is configured to receive samples including information indicative of the signal 120 and the amplified signal 125 and to use these samples to determine a non-linear transfer function associated with the amplifier 105. The control unit 115 is also configured to determine and apply one or more predistortion coefficients that may be provided to the predistortion unit 110 and used to pre-distort the input signal 130.

Techniques for forming the non-linear transfer function to determine the one or more predistortion functions and/or coefficients, such as the "Cross Correlator Predistorter" approach, are known to persons of ordinary skill in the art and, in the interest of clarity, only those aspects of determining and/or applying the predistortion functions and/or coefficients that are relevant to the present invention will be discussed further herein. In one exemplary embodiment of the Cross Correlator Predistorter approach, a response matrix (which may also be referred to as a correlation matrix) representative of a system of equations that determine the non-linear transfer function associated with the amplifier 105 may be determined using the samples. The response matrix may be inverted and/or solved used to solve a system of equations and thereby determine the non-linear transfer function associated with the amplifier 105.

Figure 2A:
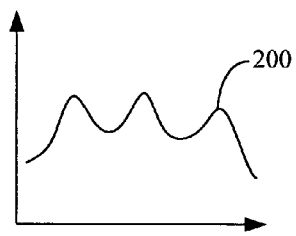
FIGS. 2A, 2B, and 2C conceptually illustrated exemplary embodiments of signals such as may be provided to and/or formed by portions of the amplifier system shown in FIG. 1, in accordance with the present invention.
Figure 2B:
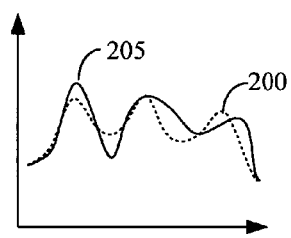
Figure 2C:
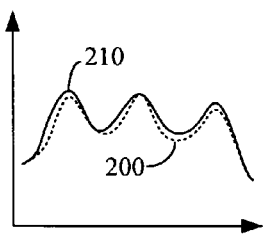

In operation, the predistortion unit 110 receives the input signal 130. One illustrative example of an input signal 200 is shown in FIG. 2A. The units for the axes shown in FIG. 2A are arbitrary. The predistortion unit 110 may then apply one or more predistortion coefficients to the input signal 130 to form the signal 120. One illustrative example of a predistorted signal 205 is shown in FIG. 2B. The units for the axes shown in FIG. 2B are arbitrary. The input signal 200 is also shown as a dashed line in FIG. 2B and the predistortion of the input signal 200 may be seen by comparing the input signal 200 to the predistorted signal 205. The signal 120 may then be provided to the amplifier 105, which may amplify the signal 120 to form the output signal 125. One illustrative example of an output signal 210 is shown in FIG. 2C. The units for the axes shown in FIG. 2C are arbitrary. The input signal 200 is also shown as a dashed line in FIG. 2C. The distortion of the output signal 215 is reduced by the predistortion of the input signal 200, as may be seen by comparing the input signal 200 to the output signal 215.

In one embodiment of the present invention, the control unit 115 may select a subset of the samples based on a sample distribution. The control unit 115 may also apply one or more weighting functions to the selected subset of the samples. The control unit 115 may then determine the response matrix associated with the amplifier 105 based on the subset of the plurality of samples, as will be discussed in detail below. The response matrix may then be inverted and/or solved, e.g., by the control unit 115, to determine the transfer function associated with the amplifier 105.

Figure 3A:
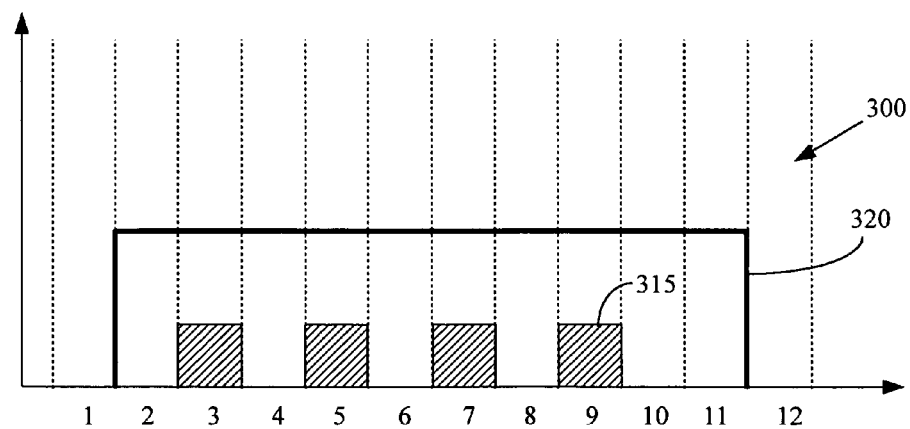
FIGS. 3A, 3B, and 3C conceptually illustrate three exemplary embodiments of sample distributions, in accordance with the present invention.
Figure 3B:
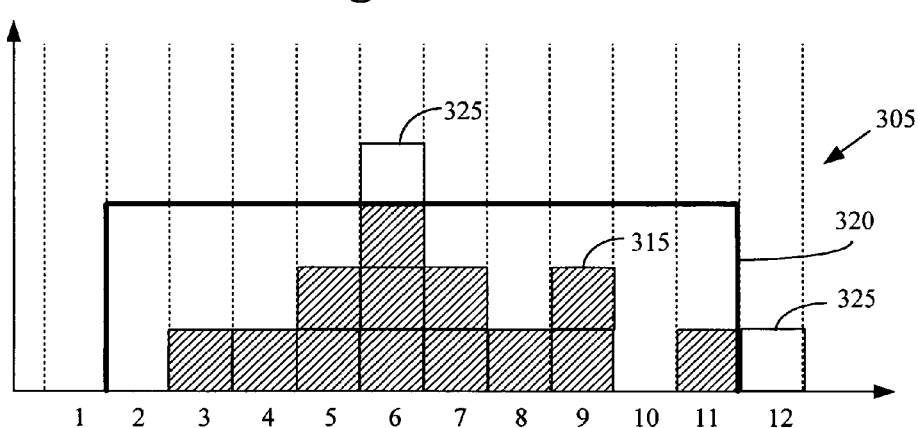
Figure 3C:
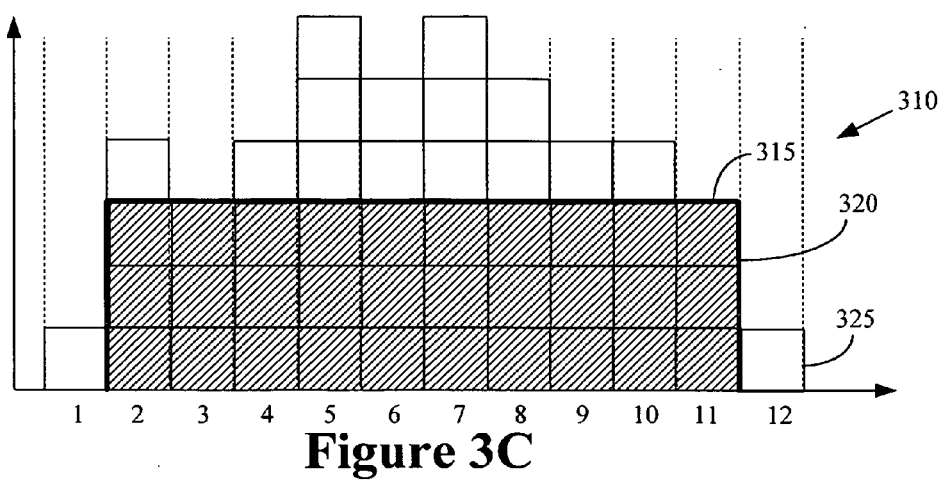

FIGS. 3A, 3B, and 3C conceptually illustrate three exemplary embodiments of sample distributions 300, 305, 310. The vertical axis in FIGS. 3A, 3B, and 3C indicates the number of samples and the horizontal axis indicates a bin number. The bin numbers may be associated with any desirable variable, such as a received radio frequency power. In the illustrated embodiment, the sample distribution 300 is depicted in FIG. 3A at a first (relatively early) stage in collecting and/or accessing samples including information indicative of an input and an output signal associated with an amplifier system. The sample distribution 305 is depicted in FIG. 3B at a second (intermediate) stage in collecting and/or accessing samples and the sample distribution 310 is depicted in FIG. 3C at the end of the collection and/or access period. Persons of ordinary skill in the art having benefit of the present disclosure should appreciate that the collection and/or access period is a matter of design choice and may be determined in any manner. For example, the collection and/or access period may be fixed time interval. For another example, the collection and/or access period may end when a predetermined number of samples have been collected or when some other criterion or threshold has been reached.

The sample distribution 300 shown in FIG. 3A includes four samples 315 (only one indicated in FIG. 3A) that have been placed in bins 3, 5, 7, and 9, respectively. A target sample distribution 320 is also shown in FIG. 3A. In the illustrated embodiment, the target sample distribution 320 is a flat distribution over the dynamic range extending from bin 2 to bin 11. However, as discussed below, any desirable target sample distribution 320 may be used. Each of the samples 315 fall within the target sample distribution 320 and so they may be selected as part of the subset of samples that may be used to determine the response matrix of the associated amplifier, as indicated by the cross-hatching. In one embodiment, each sample 315 that is selected to be part of the subset of samples may be used to generate an instantaneous (or partial) response matrix, which may be added to an average response matrix.

The sample distribution 305 shown in FIG. 3B includes 13 samples 315 (only one indicated in FIG. 3B) that fall within the target sample distribution 320 and so may be selected as part of the subset of samples that may be used to determine the response matrix of the associated amplifier, as indicated by the cross-hatching. However, the samples 325 fall outside of the target sample distribution 320 and so the samples 325 may not be selected as part of the subset of samples that may be used to determine the response matrix of the associated amplifier.

The sample distribution 310 shown in FIG. 3C includes samples 315 (only one indicated in FIG. 3C) that substantially fill the target sample distribution 320 and so all of the samples 315 may be selected as part of the subset of samples that may be used to determine the response matrix of the associated amplifier, as indicated by the cross-hatching. The samples 325 that fall outside of the target sample distribution 320 may not be selected as part of the subset of samples that may be used to determine the response matrix of the associated amplifier. By selecting the samples 315 that correspond to the target sample distribution 320, the number of samples 315 used to determine the response matrix may be reduced and an error associated with the linearization function for the amplifier may be equalized over the dynamic range associated with the target sample distribution 320.

Figure 4:
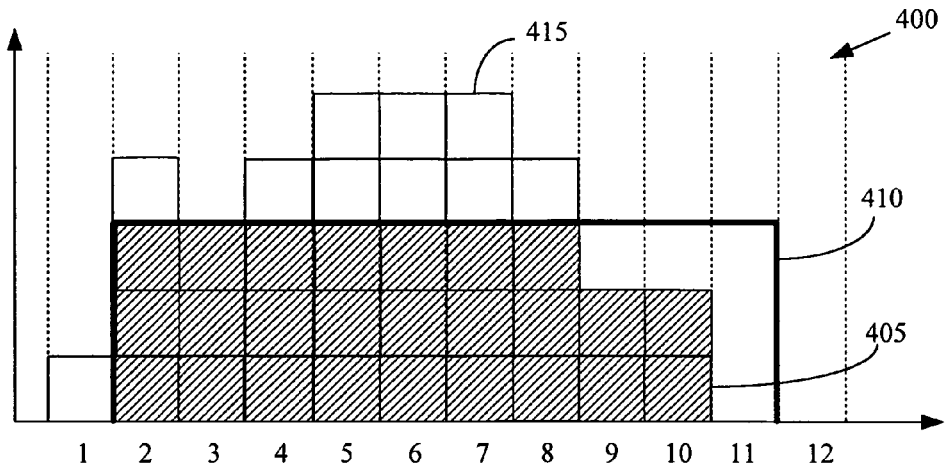
FIG. 4 conceptually illustrates one exemplary embodiment of a sample distribution at the end of a collection and/or access period, in accordance with the present invention.

FIG. 4 conceptually illustrates one exemplary embodiment of a sample distribution 400 at the end of a collection and/or access period. The vertical axis in FIG. 4 indicates the number of samples and the horizontal axis indicates a bin number. In the illustrated embodiment, the samples 405 have been selected to be part of the subset of samples that may be used to determine a response matrix associated with an amplifier, as indicated by the crosshatching. The samples 405 have been selected because they fall within a target sample distribution 410. Samples 415 have not been selected to be part of the subset of samples because the samples 415 fall outside of the sample distribution 410. Although FIG. 4 depicts the sample distribution 400 at the end of the collection and/or access period, the target sample distribution 410 has not been completely filled by selected samples 405. For example, only two samples 405 have been selected from bins 9 and 10 and no samples fell within bin 11.

A weighting function may be applied to the sample distribution 400. In one embodiment, the weighting function may be applied to correct the selected samples 405 to approximately match the target sample distribution 410. For example, the samples 405 in the bins 9-10 may each be weighted by a multiplicative factor of 3/2 to approximately match the target sample distribution 410. The bin 11 does not contain any information, and so a weighting function may not be applied to this bin. Persons of ordinary skill in the art should appreciate that the particular form of the weighting function is a matter of design choice and not material to the present invention.

Figure 5A:
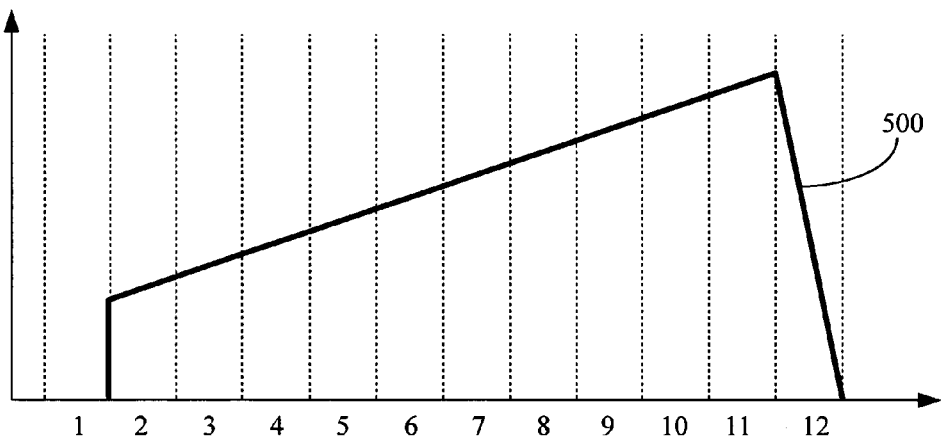
FIGS. 5A and 5B conceptually illustrate two exemplary embodiments of target sample distributions, in accordance with the present invention.
Figure 5B:
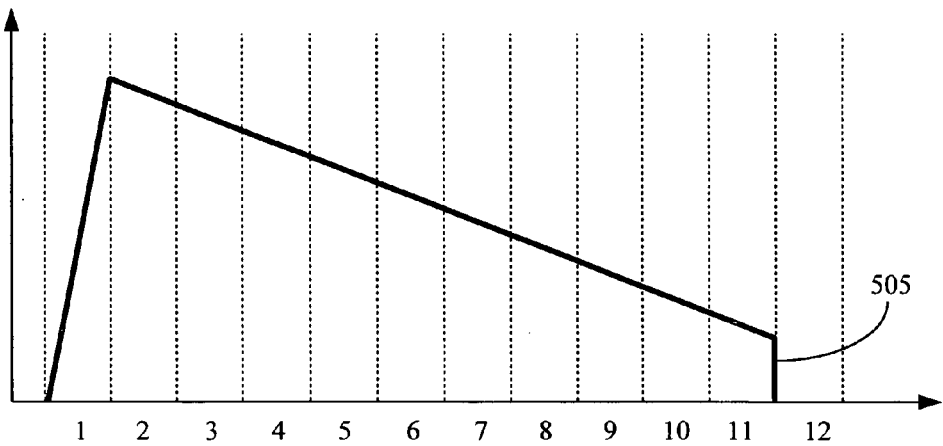

FIGS. 5A and 5B conceptually illustrate two exemplary embodiments of target sample distributions 500, 505. The vertical axis in FIGS. 5A and 5B indicates the number of samples and the horizontal axis indicates a bin number. FIG. 5A conceptually illustrates a target sample distribution 500 that provides a higher weighting to samples at higher bin numbers, which may represent higher powers. The target sample distribution 500 may be used to estimate the response matrix of an amplifier with poor high-power compression characteristics. FIG. 5B conceptually illustrates a target sample distribution 505 that provides a higher weighting to samples at lower bin numbers, which may represent lower powers. The target sample distribution 505 may be used to estimate the response matrix of an amplifier with poor low-power compression characteristics. However, as discussed above, persons of ordinary skill in the art should appreciate that any target sample distribution 500, 505 may be used.

Figure 6:
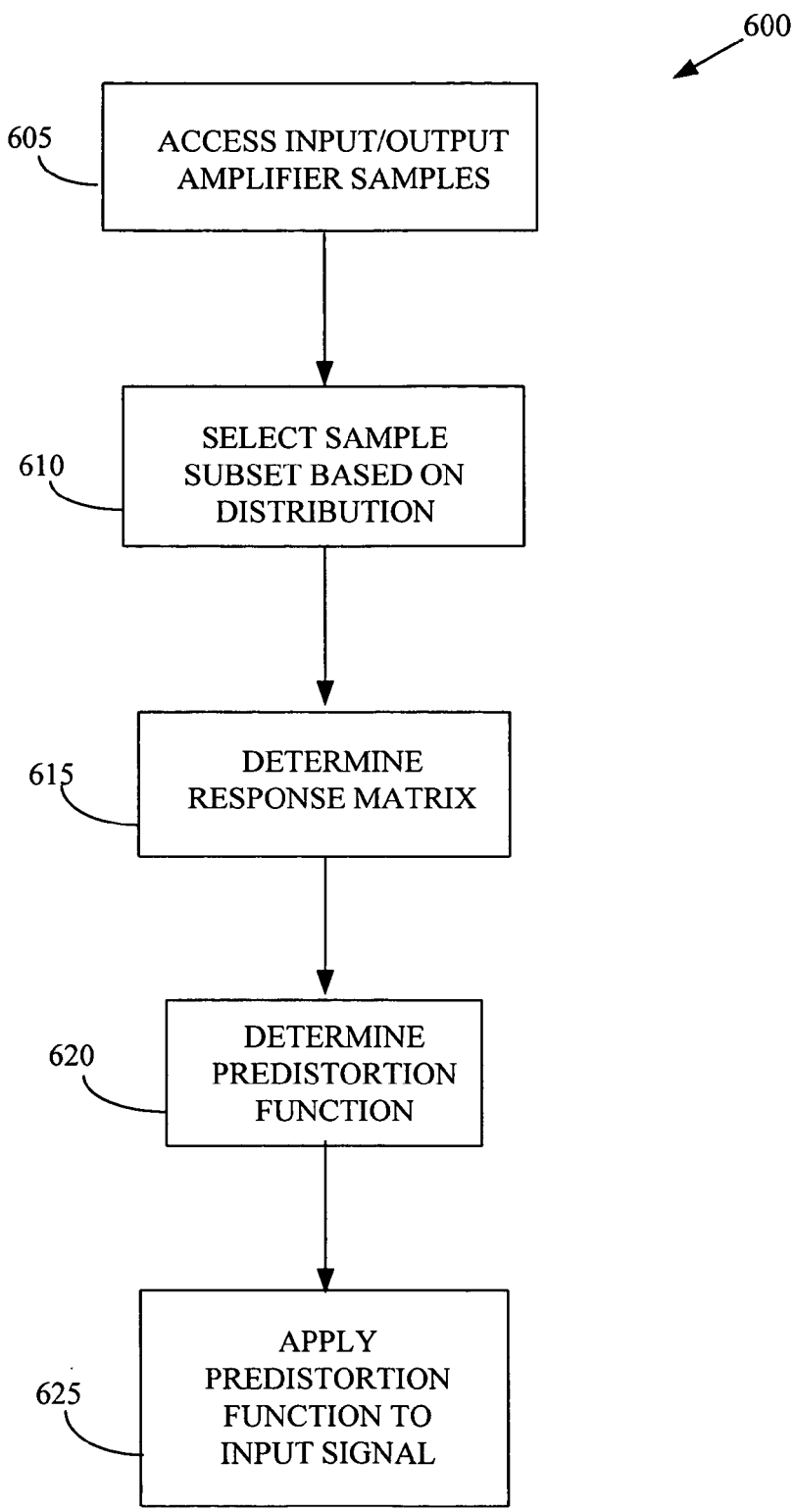
FIG. 6 conceptually illustrates one exemplary embodiment of a method of selecting samples that may be used to estimate a digital amplifier predistortion function and/or coefficient, in accordance with the present invention.

FIG. 6 conceptually illustrates one exemplary embodiment of a method 600 of selecting samples that may be used to estimate a digital amplifier predistortion function and/or coefficient. In the illustrated embodiment, one or more samples including information indicative of an input signal and an output signal associated with an amplifier are accessed (at 605). A subset of the samples is selected (at 610) based upon a target sample distribution. The subset of the samples may then be used to determine (at 615) elements of a response matrix associated with the amplifier. The response matrix may be used to determine (at 620) a predistortion function and/or coefficient, e.g., by inverting the response matrix. The response matrix and/or predistortion function may be determined (at 615 and/or 620) at a predetermined time interval or in response to an event, such as a temperature fluctuation. In one embodiment, the predistortion function and/or coefficients may be directly applied to the input signal to predistort the input signal. Alternatively, the predistortion function and/or coefficients may be stored in a lookup table for later use. For example, the predistortion function and/or coefficients may be stored in the lookup table and accessed based upon a power and/or temperature associated with the amplifier.

By determining the response matrix and/or the transfer function associated with an amplifier based on the subset of samples and/or the weighting functions, the number of samples used to generate an accurate estimate of the digital predistortion function and/or coefficients may be significantly reduced. For example, in one embodiment the number of samples may be reduced by approximately 90%. Accordingly, the processing time that may be necessary to determine the response matrix and/or invert the matrix to determine the predistortion coefficients, may be reduced and the quality of the estimate of the response matrix may be improved. Accordingly, the control unit 115 shown in FIG. 1 may be able to estimate the predistortion correction function faster, which may allow faster updates and/or tracking of the response of the amplifier 105 shown in FIG. 1 under various operating conditions. Faster estimations of the response matrix may also allow the amplifier system 100 to produce a transmitted spectrum with better spectral properties, which may introduce less nonlinear in-band distortion and/or spurious emissions in neighboring frequency bands.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
accessing a plurality of samples, each sample comprising information associated with an input signal and a corresponding output signal of an amplifier at a selected time interval;
selecting a subset of the plurality of samples based on a sample distribution that is determined prior to accessing the samples, the sample distribution being normalized to a number of samples that is determined prior to accessing the samples;
determining a transfer function associated with the amplifier based on the subset of the plurality of samples using only samples collected during the selected time interval;
determining a predistortion function based on the transfer function; and
applying the predistortion function to the input signal of the amplifier.

2. The method of claim 1, wherein accessing the plurality of samples comprises accessing information indicative of a plurality of powers associated with the input signal and the output signal.

3. The method of claim 1, wherein selecting the subset of the plurality of samples comprises associating each of the plurality of samples with one of a plurality of bins.

4. The method of claim 3, wherein selecting the subset of the plurality of samples comprises determining a threshold for each of the plurality of bins based on the sample distribution.

5. The method of claim 4, wherein selecting the subset of the plurality of samples comprises selecting a sample if the number of samples in the associated bin is less than the threshold for the associated bin.

6. The method of claim 1, wherein determining the transfer function comprises determining the transfer function at a predetermined time interval.

7. The method of claim 1, wherein determining the transfer function comprises determining a response matrix.

8. The method of claim 7, wherein determining the response matrix comprises determining a correlation matrix.

9. The method of claim 7, wherein determining the transfer function comprises inverting the response matrix.

10. The method of claim 1, comprising storing the predistortion function in a lookup table.

11. The method of claim 10, wherein applying the predistortion function comprises accessing a predistortion function from the lookup table.

12. A method involving a radiofrequency amplifier in a wireless communication device, comprising:
accessing a plurality of samples, each sample comprising information associated with an input radiofrequency signal and a corresponding output radiofrequency signal of the amplifier at a selected time interval;
selecting a subset of the plurality of samples based on a sample distribution that is determined prior to accessing the samples, the sample distribution being normalized to a number of samples that is determined prior to accessing the samples;
determining a transfer function associated with the amplifier based on the subset of the plurality of samples using only samples collected during the selected time interval;
determining a predistortion function based on the transfer function; and
applying the predistortion function to the input radiofrequency signal of the amplifier.

13. The method of claim 12, wherein accessing the plurality of samples comprises accessing information indicative of a plurality of powers associated with the input radiofrequency signal and the output radiofrequency signal.

14. The method of claim 13, wherein accessing information indicative of a plurality of powers associated with the input radiofrequency signal comprises accessing information indicative of a plurality of powers associated with at least one wireless communication device.

15. The method of claim 13, wherein selecting the subset of the plurality of samples comprises associating each of the plurality of samples with one of a plurality of bins.

16. The method of claim 15, wherein selecting the subset of the plurality of samples comprises determining a threshold for each of the plurality of bins based on the sample distribution.

17. The method of claim 16, wherein selecting the subset of the plurality of samples comprises selecting a sample if the number of samples in the associated bin is less than the threshold for the associated bin.

18. The method of claim 11, wherein determining the transfer function comprises determining a response matrix.

19. The method of claim 18, wherein determining the response matrix comprises determining a correlation matrix.

20. The method of claim 18, wherein determining the transfer function comprises inverting the response matrix.

21. The method of claim 12, comprising storing the predistortion function in a lookup table.

22. The method of claim 21, wherein applying the predistortion function comprises accessing a predistortion function stored in the lookup table.

* * * * *